(12) United States Patent
Booij et al.

(10) Patent No.: US 12,009,787 B2
(45) Date of Patent: Jun. 11, 2024

(54) SIGNAL DOWN-CONVERSION

(71) Applicant: Sonitor Technologies AS, Oslo (NO)

(72) Inventors: Wilfred Edwin Booij, Oslo (NO); Elad Shabtai, Oslo (NO)

(73) Assignee: Sonitor Technologies AS, Oslo (NO)

( * ) Notice: Subject to any disclaimer, the term of this patent is extended or adjusted under 35 U.S.C. 154(b) by 158 days.

(21) Appl. No.: 17/761,883

(22) PCT Filed: Sep. 16, 2020

(86) PCT No.: PCT/GB2020/052237
§ 371 (c)(1),
(2) Date: Mar. 18, 2022

(87) PCT Pub. No.: WO2021/053332
PCT Pub. Date: Mar. 25, 2021

(65) Prior Publication Data
US 2022/0337193 A1    Oct. 20, 2022

(30) Foreign Application Priority Data
Sep. 20, 2019   (GB) ..................... 1913604

(51) Int. Cl.
*H03D 7/16*     (2006.01)
*G01S 5/26*     (2006.01)
(Continued)

(52) U.S. Cl.
CPC .............. *H03D 7/165* (2013.01); *G01S 5/26* (2013.01); *G01S 7/526* (2013.01); *H03M 1/124* (2013.01);
(Continued)

(58) Field of Classification Search
CPC .. H03D 7/165; H03D 2200/0062; G01S 5/26; G01S 7/526; H03M 1/124; H03M 3/462; H04L 27/14; H04L 27/22
See application file for complete search history.

(56) References Cited

U.S. PATENT DOCUMENTS

| | | | |
|---|---|---|---|
| 9,985,650 B2 * | 5/2018 | Tangudu | ................ H03D 7/165 |
| 2014/0112102 A1 * | 4/2014 | Calvarese | ............... G01S 1/752 |
| | | | 367/118 |
| 2020/0200863 A1 | 6/2020 | Booij | |

OTHER PUBLICATIONS

International Search Report dated Dec. 21, 2020 for PCT Appl. No. PCT/GB2020/052237, 5 pages.
(Continued)

*Primary Examiner* — Khai M Nguyen
(74) *Attorney, Agent, or Firm* — Sterne, Kessler, Goldstein & Fox P.L.L.C.

(57) ABSTRACT

An apparatus (7) for down-converting a sampled signal comprises a processing system (206) configured to apply a mixing-and-combining operation repeatedly to successive sub-sequences of N input samples, X, representative of a signal and having an initial sampling rate, M, to generate a sequence of output samples, Y, having an output rate, T, lower than the initial sampling rate M. The sub-sequences of the N input samples, X, are spaced at intervals that correspond to the output rate M. The mixing-and-combining operation generates a respective output sample Y from each sub-sequence, where Y depends on a set of products of the input samples X of the sub-sequence with respective values derived from a periodic mixing signal having a mixing frequency.

15 Claims, 6 Drawing Sheets

(51) Int. Cl.
*G01S 7/526* (2006.01)
*H03M 1/12* (2006.01)
*H03M 3/00* (2006.01)
*H04L 27/14* (2006.01)

(52) U.S. Cl.
CPC .... *H03M 3/462* (2013.01); *H03D 2200/0062* (2013.01); *H04L 27/14* (2013.01)

(56) References Cited

OTHER PUBLICATIONS

Written Opinion dated Dec. 21, 2020 for PCT Appl. No. PCT/GB2020/052237, 8 pages.

Shu-Ming, Tseng, et al., "Software Digital-Down-Converter Design and Optimization for DVB-T Systems", CTRQ 2012: The Fifth International Conference on Communication Theory, Reliability, and Quality of Service, May 4, 2012, pp. 57-61, XP055759196, ISBN: 978-1-61208-192-2; 6 pages.

Maurer L, "Adaptive Digital Front-End Enhanced CMOS-based RF Transceivers: A Brief Overview", Integrated Nonlinear Microwave and Millimetre-Wave Circuits, 2008, INMMIC 2008, Workshop on, IEEE, Piscataway, NJ, USA, Nov. 24, 2008, pp. 111-114, XP031404875, ISBN: 978-1-4244-2645-4; 4 pages.

* cited by examiner

SIGNAL DOWN-CONVERSION

BACKGROUND OF THE INVENTION

This invention relates to down-converting a sampled signal.

When sampling an analogue signal to generate a digital representation of the signal, it is normal to sample the analogue signal at a predetermined sampling rate. This is generally achieved by sampling a continuous analogue electronic signal, such as that output by a microphone, using an analogue to digital convertor (ADC) to measure the magnitude of the analogue signal at a predetermined sampling rate.

In order to completely capture the information associated with a signal having components at a given maximum frequency, it is known from the Nyquist-Shannon Theorem that the signal must be sampled at a sampling rate equal to at least twice the maximum frequency.

For example, when sampling audio using the microphone of a typical smartphone, the sampling rate may be 48 kS/s, with a bit rate (number of data bits per audio sample) of 16-24 bits. Such a sampling rate can allow ultrasonic signals of up to around 24 kHz to be sampled accurately, in addition to audible frequencies. Ultrasonic signals may be useful for transmitting data and/or timing information to a device, such as in an ultrasound-based tracking system, e.g. as disclosed in the applicant's earlier patent application WO 2019/038542. Data may be encoded on signals using phase- or frequency-based modulation around a carrier frequency.

In order to reduce the amount of processing required to demodulate a received signal, sampled data may be down-converted from an initial sampling rate to baseband. This process is known as digital down-conversion, and is achieved by mixing the incoming sampled signal with a digital mixing signal generated by a numerically controller oscillator (NCO) and having a desired mixing frequency. The mixed samples are then low-pass filtered, to leave only difference frequencies, and decimated (down-sampled) to generate output samples having an output sampling rate that is lower than the initial sampling rate. If cosine (I) and sine (Q) mixing signals are used, the down-sampled output samples can by quadrature IQ values that preserve the phase information of the received signal.

This approach can allow sampled data to be down-converted effectively while preserving any phase- or frequency-modulation information in the original signal.

However, this down-conversion process can be quite demanding of processing resources. The present invention provides an alternative approach to down-converting sampled signals.

SUMMARY OF THE INVENTION

From a first aspect, the invention provides a method of down-converting a sampled signal, the method comprising:
receiving input samples, representative of a signal, having an initial sampling rate; and
repeatedly applying a mixing-and-combining operation to successive sub-sequences of the input samples to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

From a second aspect, the invention provides an apparatus for down-converting a sampled signal, the apparatus comprising a processing system configured to apply a mixing-and-combining operation repeatedly to successive sub-sequences of input samples, the input samples being representative of a signal and having an initial sampling rate, to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

From a third aspect, the invention provides computer software (including transitory or non-transitory media bearing the same) which, when executed on one or more processors, causes the one or more processors to apply a mixing-and-combining operation repeatedly to successive sub-sequences of input samples, the input samples being representative of a signal and having an initial sampling rate, to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

Thus it will be seen by those skilled in the art that, in accordance with the invention, mixing and down-sampling occur together through the repeated application of a common mixing-and-combining operation to successive sub-sequences of the input samples, rather than being performed as two separate operations. This can, at least in some embodiments, be implemented more efficiently than using a traditional continuous mixing operation. This may be particularly beneficial when these methods are implemented on apparatus that includes hardware optimisation for one or more steps of the mixing-and-combining operation, as described in more detail below, although this is not essential.

The input samples may be quadrature samples (i.e. complex IQ values) and the output samples may be quadrature (IQ) samples. In this way, the output samples can preserve phase information from the signal. This may be useful when demodulating phase-encoded data (e.g. phase-shift-key encoded data) and/or when determining a time of arrival of the signal with a resolution of less than one period of the mixing signal.

However, the applicant has realised that, in some embodiments, if naively implemented, the present approach may result in a loss of phase information. Thus, in some embodiments, the processing system is further configured to perform a rotation operation on the output samples. The operation may be a phase-correction operation. The rotation operation may rotate each output sample by a respective angle. (For some output samples, this angle may be zero.) The rotation operation may rotate each output sample through a constant angle relative to the immediately preceding output sample. The constant angle may depend on the mixing frequency and on the output rate. The constant angle may be the fractional part of a full rotation ($2\pi$) multiplied by the mixing frequency and divided by the output rate (e.g. 2 kS/s). For example, for a mixing frequency of 20 kHz and an output rate of 3 kS/s, each output sample would be rotated through ⅔ of 2π relative to its preceding output sample. In this way, the output rate and mixing frequency can advantageously be selected independently of each, while preserving the phase information of the signal. In embodiments that are not configured to support such a phase rotation operation, the mixing frequency may be an integer multiple of the output rate, which can avoid introducing phase errors.

The input samples may represent an electromagnetic signal or an acoustic signal. In a preferred set of embodiments, they represent an acoustic signal, such as an ultrasonic signal.

The sub-sequences may all have a common sub-sequence length. The sub-sequences may be overlapping, or abutting, or disjoint.

The software or apparatus may comprise an input for receiving data representative of a target centre frequency—e.g. from a user or from a higher-level software application. The mixing frequency may depend on the target centre frequency. The mixing frequency may equal the target centre frequency, or it may approximate the target centre frequency.

In a first set of embodiments, the mixing-and-combining operation comprises performing sample-wise multiplication of the sub-sequence of input samples with the values derived from the mixing signal—e.g. with a sine-wave mixing signal—to generate a set of sample-wise products. The mixing-and-combining operation may further comprise performing sample-wise multiplication of the sub-sequence of input samples with a cosine-wave mixing signal. In some embodiments, the input samples may be multiplied with a complex sinusoidal mixing signal, and the sample-wise products may be complex values. These multiplications may be carried out by a general-purpose processor, executing appropriate software instructions, or by a DSP. As described in more detail below, the input samples may be processed (e.g. filtered or windowed) before the mixing-and-combining operation is applied to the input samples.

A sequence of values derived from the periodic mixing signal may be stored in a memory of the apparatus; the stored sequence may have the common sub-sequence length. The same stored sequence may be used by a plurality of, or every, mixing-and-combining operation; this may be more efficient than continuously generating a mixing sequence—e.g. using an NCO. The values may be values of the mixing signal, or they may be derived from the mixing signal—e.g. after a windowing or filtering operation, as described in more detail below.

A resulting set of products (e.g. one product for each input sample) may be combined to generate the respective output sample for the sub-sequence. The mixing-and-combining operation may comprise calculating an average of the products—e.g. calculating a mean value. The output sample may equal the average of the products. This averaging may act as a low-pass filter—e.g. to remove frequency components equal to the sum of the mixing frequency and a frequency component of the input signal.

The sequence of output samples may be a sequence of baseband samples.

In a second set of embodiments, the mixing-and-combining operation may comprise calculating a discrete Fourier transform of the sub-sequence of the input samples. It may comprise generating the output sample from the magnitude of a Fourier-transform frequency bin containing, or centred on, the mixing frequency. The magnitude may be a complex number. The output sample may be generated from the magnitude of this frequency bin—e.g. equaling the magnitude of the frequency bin divided by the length of the sub-sequence. In this way, the input samples in the sub-sequence can be effectively mixed with phasor values at the mixing frequency, and combined (mean averaged), through the operation of the discrete Fourier transform. In some embodiments, the discrete Fourier transform may be a Fast Fourier Transform. Such embodiments may be particularly well suited to apparatus that comprises hardware circuitry for performing Fourier transforms—e.g. in digital logic or a field-programmable gate array (FPGA).

In a third set of embodiments, the mixing-and-combining operation may comprise applying a Goertzel-algorithm operation to the sub-sequence of the input samples. The Goertzel algorithm may be applied at the mixing frequency. The Goertzel-algorithm operation may determine the magnitude (which may be complex) of a frequency bin centred on the mixing frequency. The output sample may be generated from the output of the Goertzel-algorithm operation—e.g. equaling the magnitude divided by the length of the sub-sequence. Such embodiments are potentially more efficient than calculating a full Fourier transform (especially where no FFT hardware acceleration is available), and may require less memory than the multiplication operations of the first set of embodiments.

In some embodiments, a windowing or filter function may be applied to the input samples—e.g. before the mixing-and-combining operation is applied to the input samples—or to the sequence of output samples. The windowing or filter function may be a function that reduces sidelobes and/or flattens the passband. It may be a finite impulse response (FIR) filter, such as a low-pass filter. Examples of windowing functions that may be used include a Blackman Harris window, Kaiser window, Dolph-Chebyshev window, or low side-lobe window.

In some embodiments (e.g. in the first set of embodiments), the windowing or filter function may be applied to samples of the periodic mixing signal, instead of being applied directly to the input samples. Thus, the values derived from the periodic mixing signal may be derived by applying the windowing or filtering function to samples of the periodic mixing signal. These values may be pre-computed and stored in a memory of the apparatus (e.g. as a sequence of values equal to the common sub-sequence length). In such embodiments, when the sub-sequence of input samples is multiplied by the values derived from the mixing signal, the sub-sequence can be efficiently down-mixed and windowed (or filtered) in a single step. In some embodiments the product of the mixing signal and the windowing (or filtering) function may be pre-calculated—e.g. in response to receiving data representative of a target centre frequency.

In some embodiments, a filtering step may be applied to the sequence of output samples—e.g. an low-pass FIR filter. This may be a further filtering step, in addition to a first filtering of the input samples.

In certain embodiments, data may be received that is representative of the output rate and/or of a target bandwidth. The common sub-sequence length may depend on the target bandwidth and/or the output rate. The processing system may be configured to calculate the sub-sequence length in dependence on the output rate and/or a target bandwidth and/or the initial sampling rate. The processing system may control a filtering step in dependence on the target bandwidth—e.g. determining the width or shape of a low-pass filter based on the target bandwidth.

In embodiments involving a Fourier transform or the application of a Goertzel algorithm, the sub-sequence length (i.e. the FFT size) may be determined based, at least in part, on a proximity of one or more frequency-bin indices to a target centre frequency. It may be chosen to minimise the distance to any index of the Fourier transfer, subject to zero or more further constraints. The sub-sequence length may be calculated to minimise a cost function that includes a first cost term that scales with this distance and that includes a second cost term that scales with the sub-sequence length (possibly along with further cost terms).

In some embodiments, the output samples may be stored, output or further processed. In some embodiments, the output samples may be further down-sampled (e.g. decimated) to reduce the amount of sampled data. The processing system may be configured to demodulate the output samples. It may be configured to decode data from the output samples. It may determining a time of arrival of the signal. It may use the data and/or time of arrival to determine information about a position of the apparatus—e.g. relative to a transmitter unit that transmitted the signal.

In some embodiments, the input samples may have been up-sampled to the initial sampling rate. This may be useful for obtaining non-integer down-conversion ratios.

The processing system of the apparatus may comprise any appropriate hardware and/or software. The processing system may comprise processing circuitry and/or one or more processors and memory storing software for execution by the one or more processors. The processing circuitry and/or software may implement any of the features disclosed herein. The memory may be a volatile or non-volatile memory.

In some embodiments the apparatus may be a mobile receiver device. The mobile receiver device may further comprise a battery. The mobile receiver device may comprise a communication system such as a radio receiver or transceiver. In some embodiments the mobile receiver device may be a smartphone (cell phone), a general-purpose computing device or a wearable device such as a location tag.

In some embodiments, the signal may comprise a modulated signal on a periodic carrier wave having a carrier frequency. In some embodiments, the carrier wave may be an ultrasonic carrier wave with a frequency in the range 20-40 kHz. In some embodiments, the modulated signal may be encoded on the carrier wave using a form of phase-shift keying (PSK) or frequency-shift-keying (FSK).

In some embodiments the signal may be transmitted from a transmitter unit on a known carrier frequency. In some embodiments the modulated signal encoded on the carrier wave may be known signal specific to the transmitter unit.

In some embodiments, the software may be driver software. It may provide an interface for receiving a target centre frequency from a software application. In certain embodiments, in addition to a target centre frequency, it may be configured to receive a target bandwidth and output rate from a software application. The target centre frequency, target bandwidth and output rate may depend on the requirements of the software application—e.g. depending on a communication protocol implemented by the software application.

In some embodiments, the software or processing system may be configured to output the generated output samples. This may comprise sending the output samples to further software stored in a memory of the processing system, or may comprise a wireless transmission to another device.

The apparatus may comprise an analogue-to-digital converter (ADC) for generating the input samples. It may comprise an antenna, microphone of other transducer for receiving the signal, for inputting to the ADC. It may comprise an amplifier.

In some embodiments the input samples may be stored in a memory of the apparatus—e.g. in a buffer. In embodiments in which the mixing signal is applied through software-implemented multiplication operations, the values derived from the mixing signal may be stored in an array. In embodiments in which a windowing or filtering function is applied, values representative of the windowing function may be stored in an array, e.g. of size equal to the sub-sequence length.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
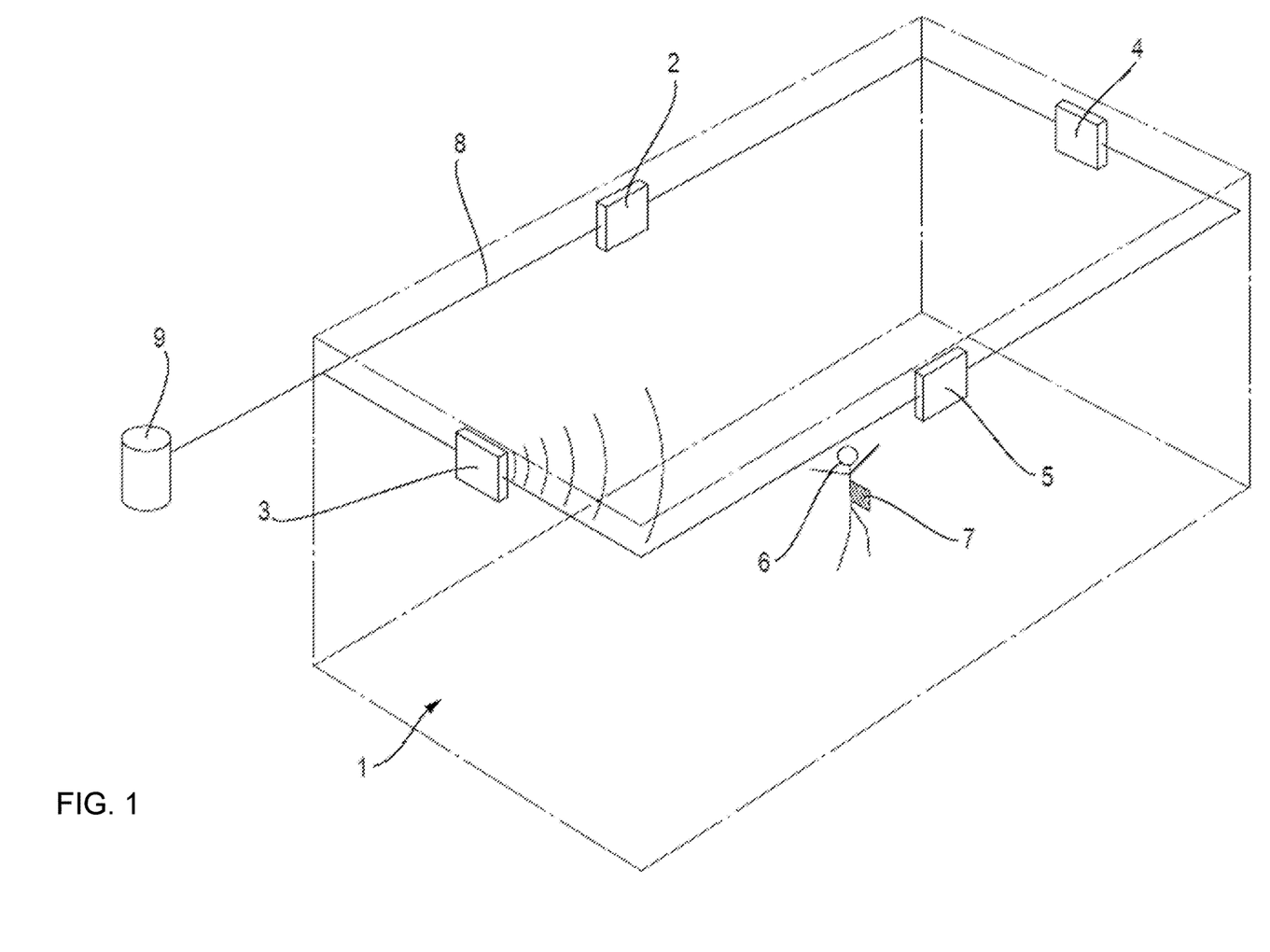
FIG. 1 is a perspective diagram of a positioning system embodying the invention.

FIG. 1 shows part of a positioning system in which the invention may be applied. This system may be used in, for example, a shopping mall, in order to determine the locations of shoppers within the shopping mall. The example described herein represents one example environment, however the positioning system could also be used in warehouses, hospitals, domestic homes, vehicles, etc.

FIG. 1 shows a room 1, in which a person 6 carrying a mobile receiver unit 7 is situated. Each of the four walls of the room has a static transmitter unit 2, 3, 4, 5 affixed to its surface. Each of the transmitter units 2, 3, 4, 5 is connected via network cable to a server 9, which is typically located in another room or in another building. These components comprise a positioning system, able to detect the three-dimensional location of the receiver unit 7 within the room 1. In practice, the system may include additional similar transmitter units, installed throughout a building or series of rooms, and a plurality of similar mobile receiver units attached to, or incorporated into, people, animals, vehicles, robots, stock, equipment, etc.

Figure 2:
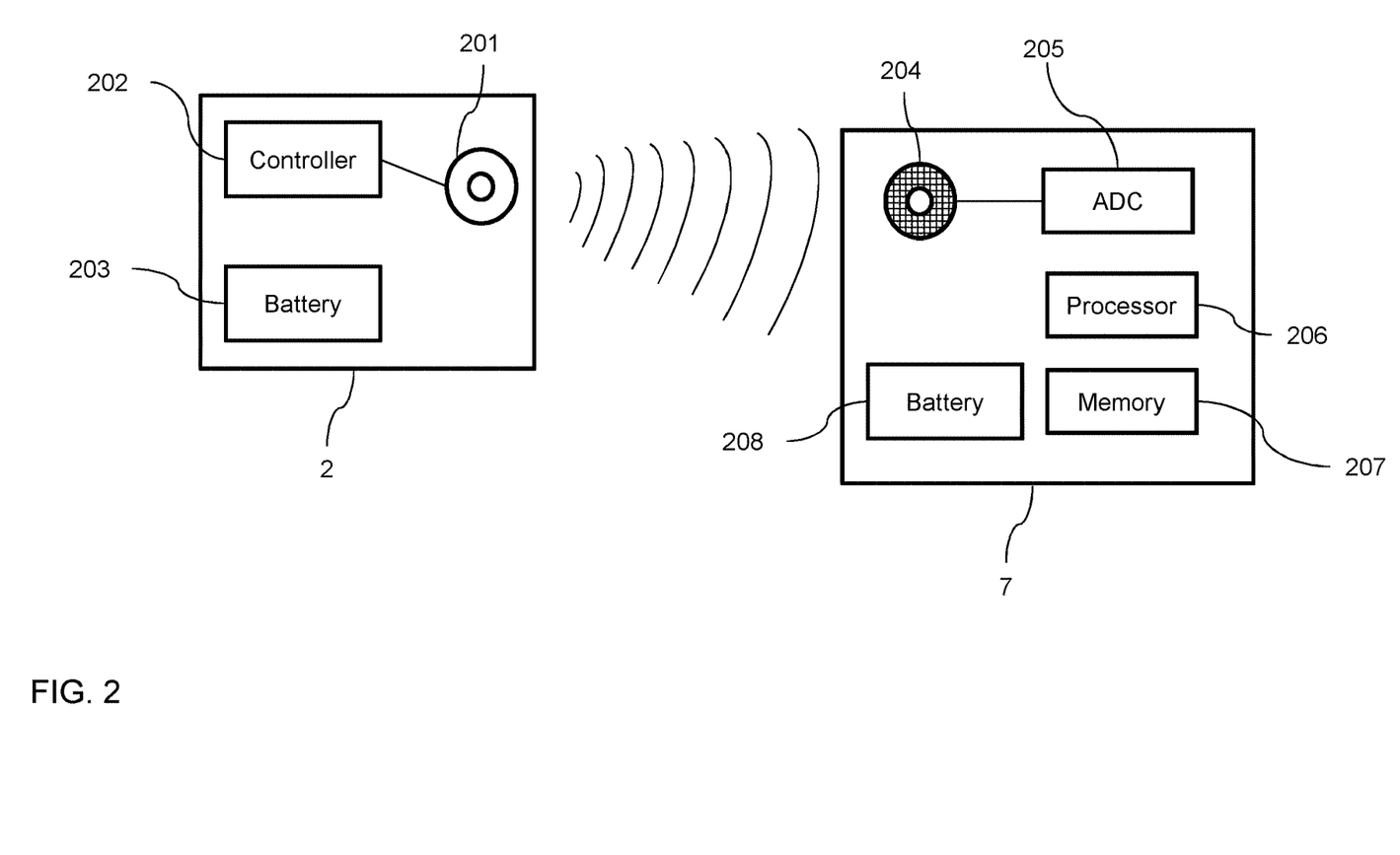
FIG. 2 is a schematic drawing of a static transmitter unit and a mobile receiver unit of the system.

FIG. 2 is a schematic representation of a representative transmitter unit 2 of the transmitter units 2, 3, 4, 5 and the mobile receiver unit 7. Each transmitter unit 2, 3, 4, 5 has a respective ultrasonic sounder 201, a controller 202 for causing the ultrasound transducer 201 to transmit ultrasonic signals, and a battery 203 for supplying power to the transmitter unit. The mobile receiver unit 7 has a microphone 204 capable of receiving ultrasonic signals from the transmitter units 2, 3, 4, 5, an analogue to digital converter (ADC) 205 to convert the signals received from the microphone to the digital domain, and a processor 206 for processing the received digital signals. The mobile receiver unit 7 also includes a memory 207 to store software instructions and data, and a battery 208 for powering the mobile receiver unit 7. The mobile receiver unit 7 may have other components not shown here. It may be a dedicated location tag, or it could be a smartphone (cell phone) or a general-purpose computing device.

In use, the server 9 causes each of the transmitter units 2, 3, 4, 5 to transmit a signature unique to that transmitter unit to the mobile receiver unit 7 at certain time intervals. The mobile receiver unit 7 and the transmitter units 2, 3, 4, 5 are preferably synchronised, such that when the mobile receiver unit 7 detects a signature it can, in combination with the known location of the transmitter unit from which the signature was received, calculate a time-of-flight (TOF) for the received signature. By combining three or more TOF measurements from different known transmitter locations, the position of the mobile receiver unit 7 can be determined using known principles of trilateration or multilateration. These calculations may be carried out on the mobile receiver unit 7 or at the remote server 9.

The signatures sent by the transmitter units 2, 3, 4, 5 may be encoded on an ultrasonic carrier—e.g. a 20 kHz or 40 kHz carrier—using a form of phase-shift keying (PSK) or frequency-shift-keying (FSK). They may be encoded using a CCK-like PSK encoding, e.g. as disclosed in WO 2019/038542, or using CP-FSK, or in any other way.

The mobile receiver unit 7 of FIG. 2 is designed to sample audio signals received at the microphone 204 at a predetermined initial sampling rate, S, which may be relatively high.

When the sampled signal is subsequently processed by the processor 206, a high sampling rate may be disadvantageous, as it results in greater quantities of data to be stored, and more computational power is needed to manipulate the sampled data. In systems in which available memory or computational resources are at a premium, for example in mobile devices such as the mobile receiver unit 7 (which could be a smartphone or sensor device), efficient down-sampling of signals is required.

Furthermore, different software applications executing on the processor 206 may have different requirements for the effective sampling rate. They may also require only a particular portion of the audio spectrum to be sampled—i.e., a particular centre frequency and bandwidth.

Three alternative groups of methods of down-sampling of received ultrasound signals are disclosed below, all of which enable the efficient down-mixing of sampled audio data to a selected target output sampling rate, T, for a desired centre frequency and bandwidth, while still preserving phase information. A particular mobile receiver unit 7 may implement any one of these methods, or may support two or more of the methods. What method or methods are supported by the mobile receiver unit 7 may depend on the hardware capabilities of the unit 7—e.g. on whether the unit 7 contains a DSP or other component optimised for performing power-efficient discrete Fourier transforms (DFTs), or on how much of the memory 207 is available for storing intermediate calculation results from the down-mixing operation.

In a first set of embodiments, a mixer approach is used, in which a predetermined number of samples of the ultrasound signal are digitally mixed with a periodic mixing signal.

In a second set of embodiments, an approach employing a Fast Fourier Transform (FFT) is used, in which an FFT is performed repeatedly on successive sub-sequences of the sampled signal at a target rate, T. Each time, one FFT bin value is selected, containing the target centre frequency, which effectively down-mixed the incoming samples to baseband around the target centre frequency.

In a third set of embodiments, the Goertzel algorithm is used to evaluate the FFT bin of interest, instead of a full FFT, which may be more efficient on some devices.

Mixer Approach

Figure 3:
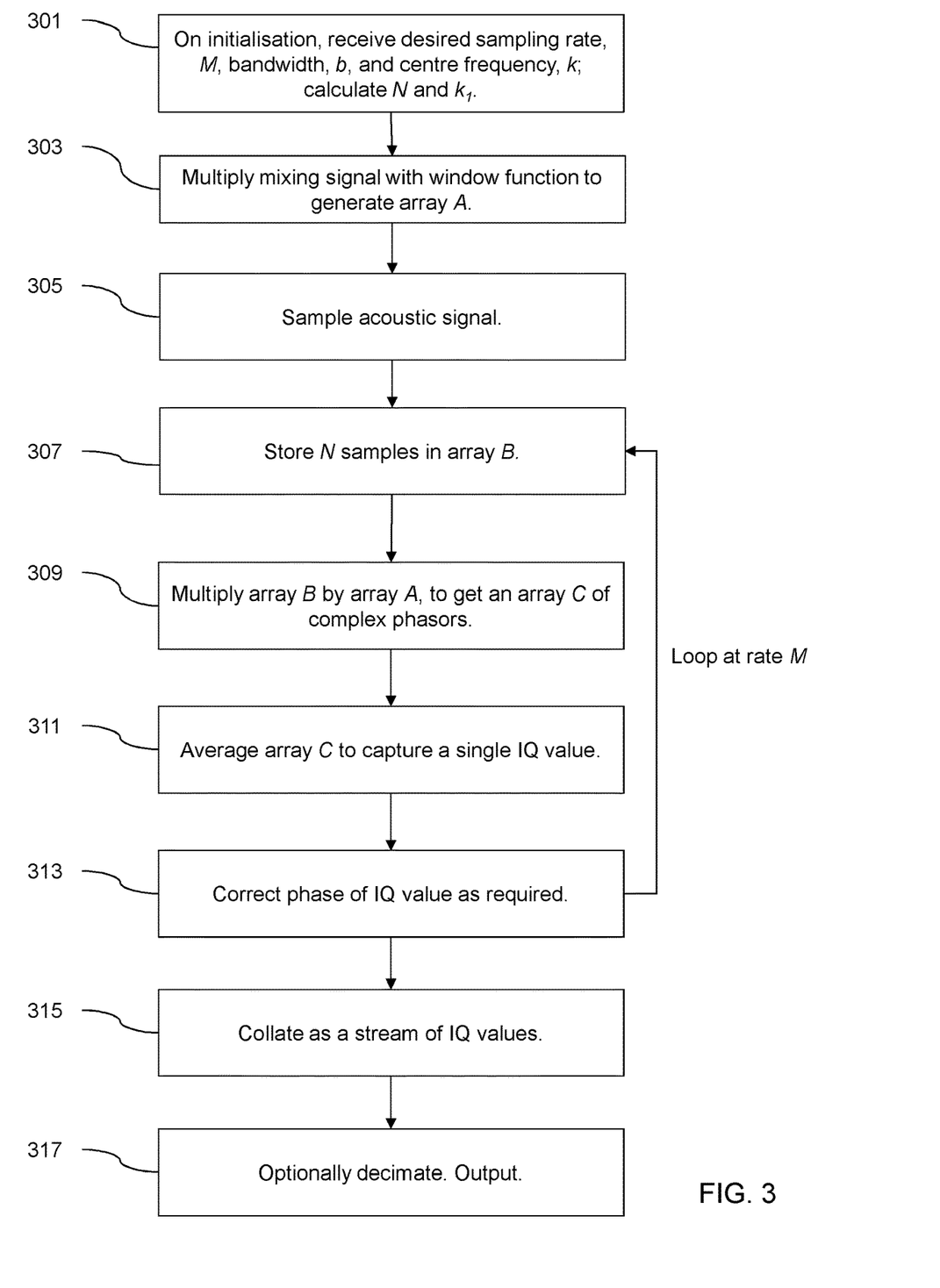
FIG. 3 is a flow diagram of steps performed by software executed by a processor of the mobile receiver unit in the process of down-sampling ultrasound signals according to a first embodiment of the invention.

FIG. 3 is a flow diagram of steps performed by software executed by the processor 206 of the mobile receiver unit 7 in the process of down-sampling acoustic (e.g. ultrasound) signals according to a first set of embodiments of the present invention. The down-sampling software combines signal mixing, filtering and decimation to efficiently down-sample ultrasound signals to baseband, while preserving phase information.

On initialisation, a desired target centre frequency, k, bandwidth, b, and target output sampling rate (output rate), T, are communicated from a software application to an audio driver. These values may depend on the requirements of a particular software application and on the acoustic communication protocol the software supports. For example, the software application could be a navigation app provided by a supermarket operator, which tracks a user around a supermarket based on continuous phase (CP)-FSK-encoded ultrasonic codes received by the mobile unit 7 from ultrasound beacons located at known points in the store. The software application may, for example, instruct the audio driver to provide the application with baseband complex (I & Q) samples of the channel 19.5-20.5 kHz at a target sample rate of 2 kS/s, down from an initial sample rate, S, of 48 kS/s (i.e., k=20 kHz, b=1 kHz, T=2 kS/s, S=48 kS/s).

In these mixer embodiments, the target centre frequency, k, may sometimes be used directly as the mixing frequency for the mixing signals. However, in general, such an approach may cause problems of aliasing or spectral leakage, and so k is used to calculate an actual mixing frequency, $k_1$, which may be close to, but is not necessarily equal to, k. The selection of $k_1$ is also tied in with the selection of a mixing window size, N.

In some embodiments, $k_1$ and N are chosen to satisfy:

$$k_1 = \frac{\text{Round}\left(k \cdot \frac{N}{S}\right) \cdot S}{N}$$

where S is the initial sampling rate, and where N is selected to strike a compromise between reducing the rounding error and reducing the amount of processing required (which increases as N increases). The desired bandwidth, b, may also be used to influence the choice of N in some embodiments. This calculation is analogous to the selection of an FFT size for which $k_1$ is centred on a Fourier bin, as explained in more detail below with reference to the Fourier transform approach. Moreover, the values may be chosen so that the bandwidth of the filtering and mixing operation does not give rise to any overlap with a sampled bandwidth which is periodic in k in the frequency domain, so as to prevent aliasing.

In a pre-calculation stage, cosine (I) and sine (Q) digital mixing signals, both with period $S/k_1$ samples (e.g., with a period of 2.4 samples, if S=48 kS/s and $k_1$=20 kHz), are then generated within the driver software, and each is multiplied by a window or filter function with N elements (block 303). This generates an array, A, of N complex values, containing information from both the window function and the N mixer phasor values. Any suitable windowing function may be used, such as a Blackman Harris window, Kaiser window, Dolph-Chebyshev window or low side-lobe window. For windows that have a tuning parameter, a parameter value is chosen that strikes an acceptable balance between passband flatness and low sidelobes. In one example, the window function may be a windowed low-pass FIR filter of length N—e.g. having a steep transition band above 1 kHz and full attenuation beyond 2 kHz.

An acoustic signal is sampled from the microphone 204 (block 305) at an initial sampling rate, S (e.g., 48 kS/s), which may be fixed or variable, by the ADC 205. The driver restricts the centre frequency, k, and bandwidth, b, that can be selected by the software application based on the maximum supported sampling rate, S, according to the Nyquist theorem, so that the sampling rate will always be greater than the twice the frequency of the upper end of any selectable band. In this way, a received analogue signal is converted from the analogue domain to the digital domain using the ADC 205, to be further processed by processor 206. The samples are stored in the memory 207 in an on-going process. The digitised ultrasound signal is then down-mixed and decimated as follows.

Every M samples, a set of N samples is acquired and stored in an array B in the memory 207 (block 307), where M=S/T (e.g., every 24 samples, if S=48 kS/s and T=2 kS/s). The array B is then multiplied by the windowing array, A (block 309). This serves to down-mix the N elements of the array B, allowing critical sampling of the captured signal, in a manner similar to that of a finite impulse response (FIR) filter, to be carried out, resulting in a third array, C, of complex phasors.

The array C of filtered values is then averaged (block 311)—e.g. by calculating the mean value—to acquire a single complex number representative of the windowed average IQ value of the sampled data in the set of N samples. This averaging step, in combination with the pre-computed window, serves as a low-pass filter for the received samples.

Depending on the values of the target sampling rate, T, and the target centre frequency, k, the N mixer phasor values may have a phase which is offset from the phase of the mixing signal used to pre-calculate the array A. This will occur when the phasor filter array A is stepped through the incoming samples by a non-integer number of periods of the mixing signal. This will generally be the case, unless the actual mixing frequency, $k_1$, happens to be an integer multiple of the target sample rate, T.

The driver software therefore includes a phase-correction routine, for correcting the phase of each acquired IQ value, so that the down-mixed stream of IQ values accurately represents the phase of the sampled ultrasound signal. In cases where $k_1/T$ contains a fractional component, the phase of each IQ value is corrected (block 313) by rotating each successive complex IQ value through a corresponding fraction of a full oscillation period relative to the preceding IQ value.

The rotation angle is given by $$\theta = -2\pi \cdot Frac\left(\frac{k_1}{T}\right)$$

These steps 307, 309, 311, 313 are repeated every M samples to generate a stream of IQ values (block 315).

This approach decouples the target IQ sampling rate, T, from the centre frequency, $k_1$, and hence allows the target sampling rate to be selected arbitrarily. Many IQ sampling rates can therefore be supported by changing the stepping distance, M, at which sets of N samples are acquired, allowing IQ values to be obtained at a desired rate, T.

Figure 4:
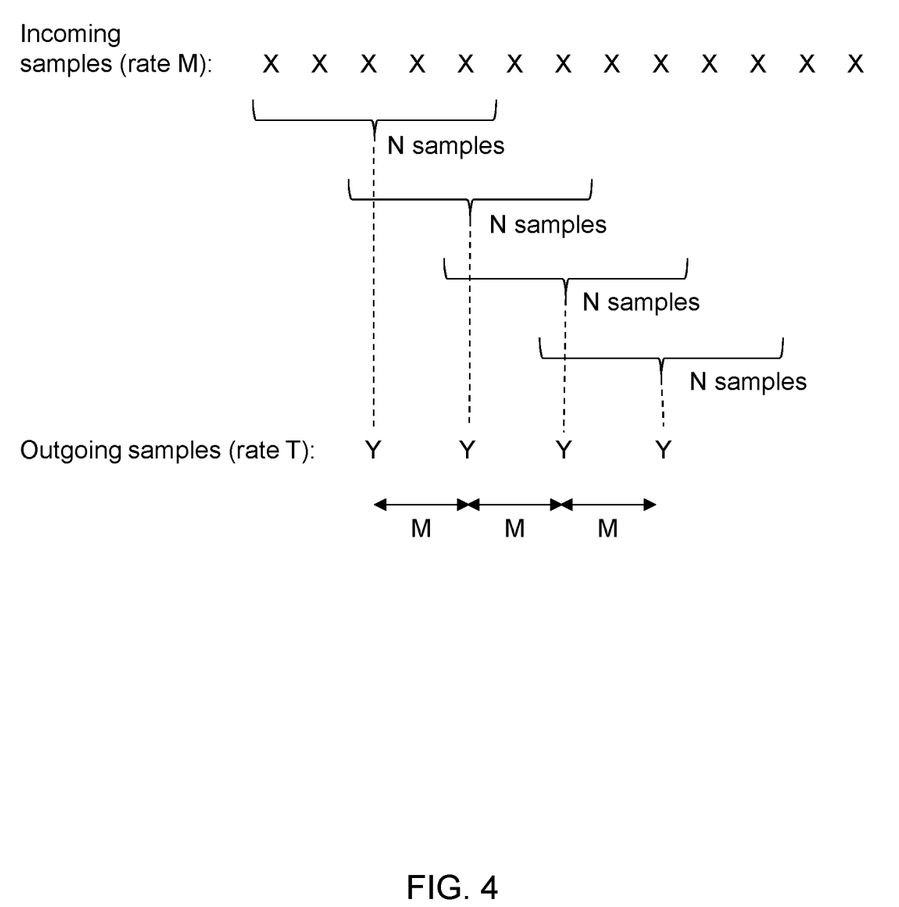
FIG. 4 is a diagram showing how an down-sampled stream is generated from an incoming sample stream in the first embodiment.

FIG. 4 shows an exemplary stream of incoming samples, at rate M, being down-sampled to give an outgoing stream of samples, at rate T, by applying the mixing filter array A to successive sub-sequences of N incoming samples with a step size of M samples (where M=S/T). In this particular example, N=5 and M=2, but this is merely by way of illustration. Any suitable values may be used.

In some embodiments, additional filtering of the output IQ samples may be performed—e.g. a steep low-pass FIR filter. This may be helpful if the windowing does not provide sufficiently-sharp bandpass filtering for the output samples; for example, a 7-term Blackman Harris window can give excellent mixing selectivity, but may provide insufficient bandpass filtering. A low-pass filtering (e.g. FIR low pass filter) of the IQ baseband signal is thus performed in some embodiments, which can reduce the bandwidth of the baseband signal. The size or shape of the filter may be selected based on the desired bandwidth, b, received as input to the driver software.

In some embodiments, an additional decimation step may be performed on the IQ baseband signal, if required (block 317), to further reduce the final output sampling rate and bandwidth—e.g. to reduce the output rate from an initial output rate of 4 kS/s to a desired final output rate of T=2 kS/s. This may help to enable the desired bandwidth, b, received in block 301, to be realised. Decimation is preferred over resampling in this case, due to the much reduced processing load.

Fourier Transform Approach

Figure 5:
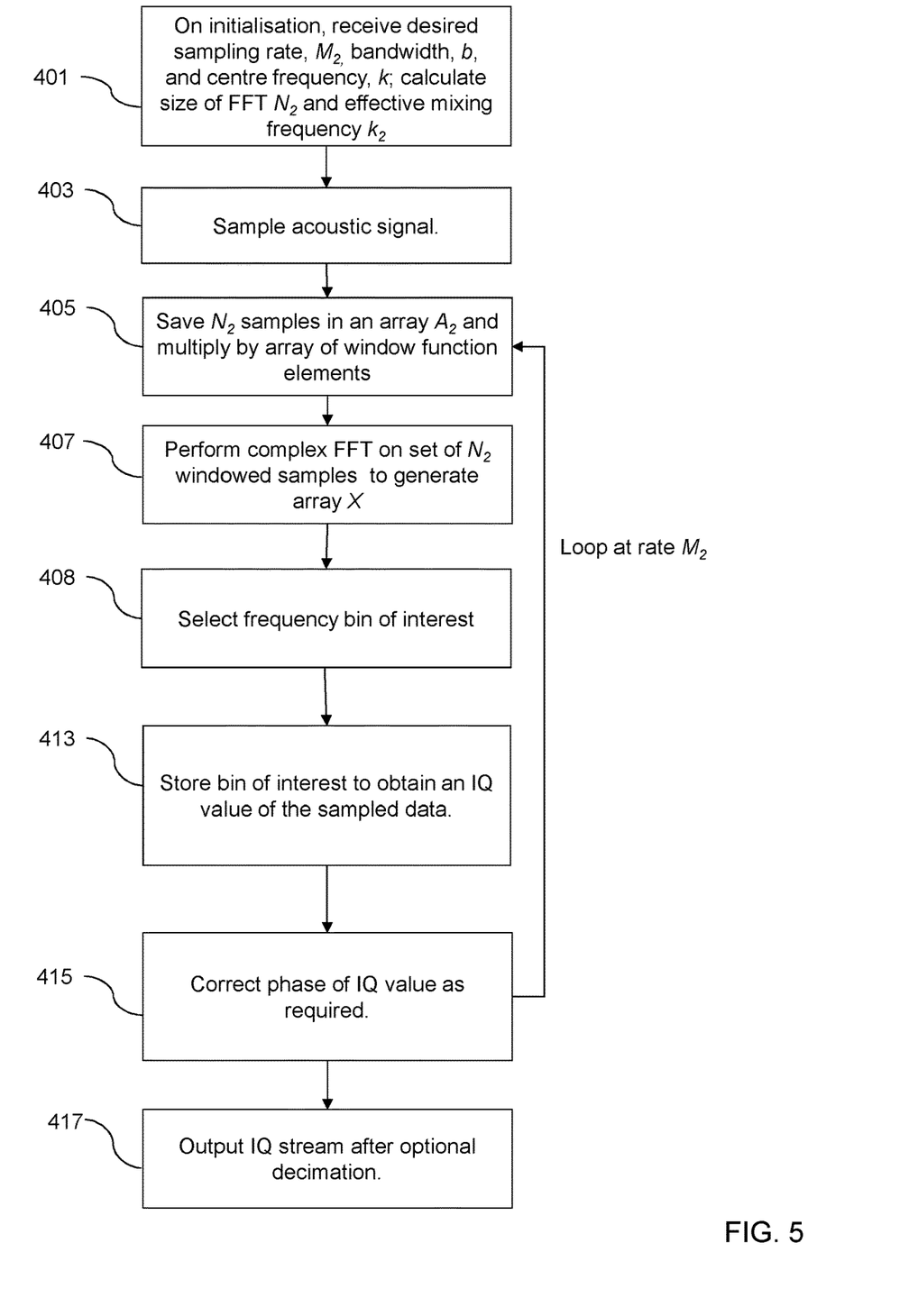
FIG. 5 is a flow diagram of steps performed by software executed by a processor of the mobile receiver unit in the process of down-sampling ultrasound signals according to a second embodiment of the invention.

FIG. 5 is a flow diagram of steps performed by software executed by the processor 206 of the mobile receiver unit 7 in the process of down-sampling acoustic signals according to a second set of embodiments of the present invention. The down-sampling means in the second embodiment employs a similar initialisation step (block 401) to that outlined previously, in which a specific bandwidth, b, and centre frequency, k, are received. In these second embodiments, these values are used to calculate an FFT size, $N_2$, and an effective mixing frequency, $k_2$. The FFT size, $N_2$, should be chosen such that one of the FFT bin indices is as close as possible to the desired centre frequency, potentially subject to the choice of FFT size being constrained by the hardware of the unit 7 and/or having a greater computation cost as the FFT size increases. If non-radix two FFT is available, the bin index can be selected to be an integer.

For instance, the requested centre frequency, k, may be used by the driver to select a sample length, $N_2$, and a nearest frequency bin, represented by the integer l, which is used when down-sampling the output of the ADC 205, according to $$l = \text{Round}\left(k \cdot \frac{N_2}{S}\right)$$

where S is the initial sampling rate, and where $N_2$ is an integer selected to strike a compromise between reducing the rounding error and reducing the amount of processing required (which increases as $N_2$ increases). The desired bandwidth, b, may also be used to influence the choice of $N_2$ in some embodiments.

$$k_2 = \frac{l \cdot S}{N_2},$$

The true centre frequency (i.e. the actual mixing frequency) is then which approximates, but may not always equal, the desired target mixing frequency, k.

As before, the ADC 205 samples the ultrasound signal at a rate S (block 403).

Every $N_2$ samples are acquired and stored in the memory 207 in an array of size $N_2$, which is multiplied by a window function of $N_2$ elements to generate an array, $A_2$, of size $N_2$ (block 405). A typical size may be $N_2=1024$. Any appropriate windowing option may be applied, such as a Blackman Harris window, Kaiser window, Dolph-Chebyshev window or low side-lobe window. In these embodiments, the window function is preferably chosen to suppress side-lobes that would otherwise occur following a Fast Fourier Transform (FFT) of the sampled signal.

A complex Fast Fourier Transform (FFT) is then applied to the array $A_2$ of $N_2$ windowed samples recorded in the time domain (block 407). The complex baseband sample can then be found by simply selecting (block 408) the frequency bin of the FFT result for $k_2$ and dividing the complex value of this bin by $N_2$ (block 413). This follows from how each bin of the discrete Fourier transform is calculated, as the sum of the products of the $N_2$ windowed samples with a complex phasor at the bin's centre frequency:

$$X(\omega_k) \triangleq \sum_{n=0}^{N-1} x(t_n) e^{-j\omega_k t_n}, k = 0, 1, 2, \ldots, N-1,$$

Dividing a single complex Fourier bin value by N therefore calculates the mean of the N samples, mixed with a mixing signal at the bin centre frequency. This is equivalent to the mixing and averaging operations in steps 309, 311 of the first set of embodiments.

The FFT is performed on successive sets of $N_2$ windowed samples at intervals of $M_2$ corresponding to the desired target sampling rate, T. Any arbitrary rate $M_2$ may be chosen, to effectively down-sample the ultrasound signal around the frequency of interest to the desired sampling rate, T. A typical sampling rate might be 3 kS/s.

This operation allows a down-mixed stream of IQ values to be stored in the memory 207 at the desired sampling rate T.

However, when the ratio of the target IQ sampling rate, T, and the bin centre frequency, $k_2$, is non-integer, the phase of the acquired IQ values will need to be corrected in order for the down-mixed stream of IQ values to effectively represent the sampled ultrasound signal. This is because each FFT calculation uses the same initial phase, but the repeated FFT calculations are not stepped by an integer multiple of the wavelength of the bin centre frequency, so a phase offset occurs between each FFT calculation. The phase of the IQ values can be corrected (block 415) in the same way as described previously for the first set of embodiments, but using $k_2$ instead of $k_1$.

The target sampling rate, T, may in some cases still be higher than necessary for subsequent operations, and hence optional decimation may be carried out if required. The IQ values are then output to the software (block 417).

Goertzel Approach

Figure 6:
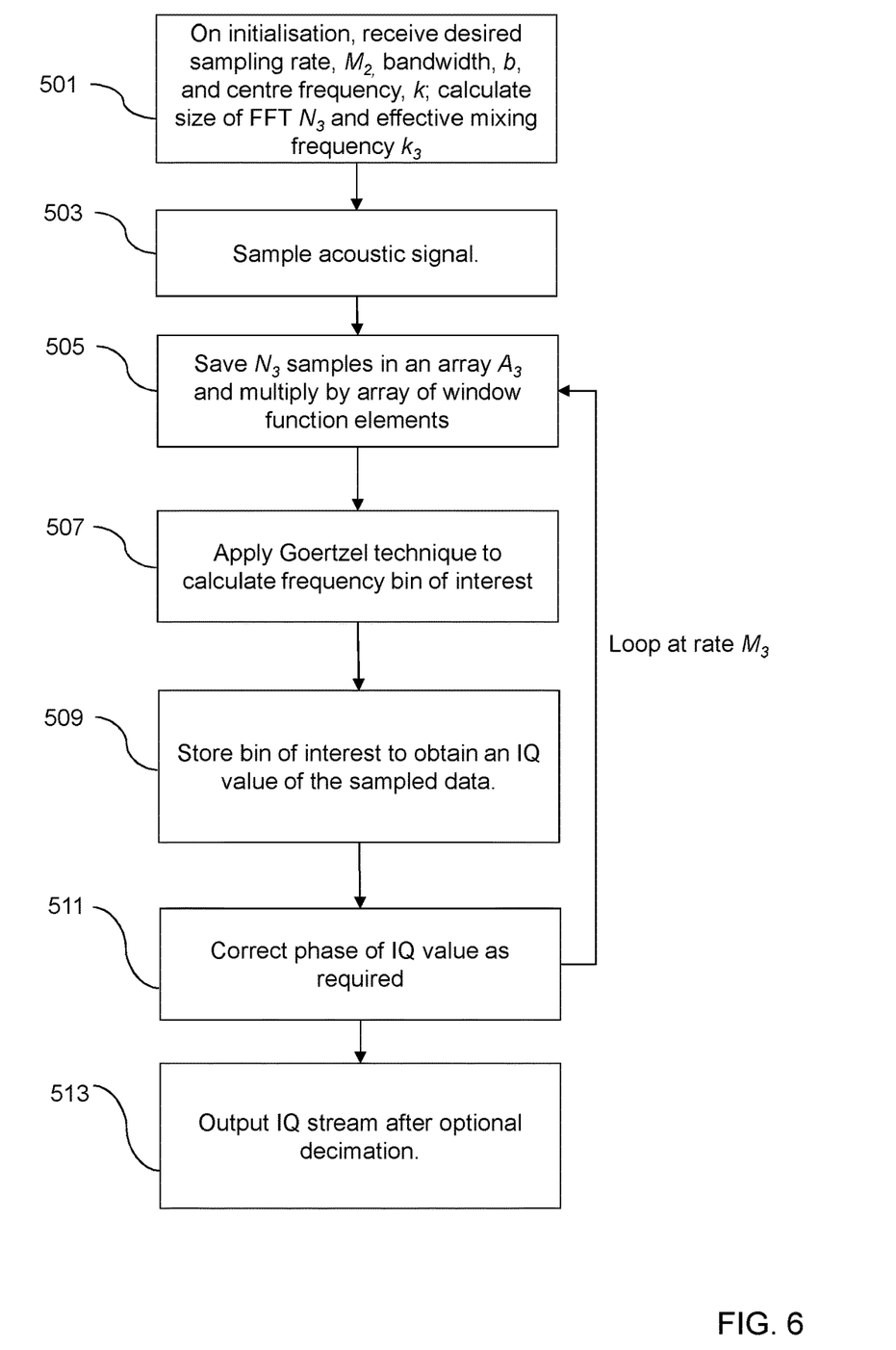
FIG. 6 is a flow diagram of steps performed by software executed by a processor of the mobile receiver unit in the process of down-sampling ultrasound signals according to a third embodiment of the invention.

FIG. 6 is a flow diagram of steps performed by software executed by the processor 206 of the mobile receiver unit 7 in the process of down-sampling ultrasound signals according to a third set of embodiments of the present invention. These embodiments are similar to those of the second set of embodiments, except that the Goertzel algorithm is used instead of calculating a full FFT.

The down-sampling means in these embodiments employs a similar initialisation step (block 501) to that outlined previously, in which a specific bandwidth, b, and centre frequency, k, are requested. In the third embodiments, these values are used to calculate an FFT size, $N_3$, and an effective mixing frequency, $k_3$. The FFT size should be chosen such that one of its indices is as close as possible to the desired centre frequency. As before, this may be constrained by the hardware.

After initialisation, an ultrasound signal is sampled from the microphone 204 (block 503) at a sampling rate, $S_3$.

Every $N_3$ samples are acquired and stored in the memory 207 in an array of size $N_3$, which is multiplied by a window function with $N_3$ elements to generate an array, $A_3$, of size $N_3$ (block 505). A typical size may be 1024. Any appropriate windowing operation may be applied, such as a Blackman Harris window, Kaiser window, Dolph-Chebyshev window or low side-lobe window. In these embodiments, a window function is preferably chosen to suppress side-lobes that may occur following a Fast Fourier Transform (FFT) of the sampled signal.

Instead of calculating a full FFT, only to discard all but one bin coefficient, the Goertzel technique is used to efficiently calculate the value for the bin containing the mixing frequency, $k_3$ (block 507). The value of this bin is then divided by $N_3$ and stored in memory as an IQ value for the output stream (block 509). This approach may be particularly well suited to implementation on low-end microcontrollers, where the available memory 207 for storing large amounts of FFT data is limited.

As with the previous embodiments, any arbitrary stepping period $M_3$ may be chosen to effectively down-sample the ultrasound signal, around the centre frequency, $k_3$, to the desired sampling rate, T.

When the ratio of the target IQ sampling rate, T, and the centre frequency, $k_3$, is non-integer, a phase shift of the sampled data occurs. However, this can be corrected through a complex rotation of the sampled IQ values (block 511), as described above. This decouples the IQ sampling rate (which is equal to the stepping rate $M_3$) from the carrier frequency, and hence allows the sampling rate, T, to be selected arbitrarily.

In some instances, the sampling rate, T, may still be higher than necessary for subsequent operations, and hence optional decimation may be carried out if required, before the stream of IQ values is output to the software application (block 513).

It will be appreciated by those skilled in the art that the invention has been illustrated by describing one or more specific embodiments thereof, but is not limited to these embodiments; many variations and modifications are possible, within the scope of the accompanying claims. For instance, some embodiments may support more than one of the approaches disclosed herein, e.g. selectably, or may combine elements from any two or more approaches.

The invention claimed is:

1. A method of down-converting a sampled signal, the method comprising:
   receiving input samples, representative of a signal, having an initial sampling rate; and
   applying a mixing-and-combining operation to each of a succession of sub-sequences of the input samples to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

2. The method of claim 1, wherein the signal comprises phase-encoded data and wherein the input samples and output samples are quadrature samples.

3. The method of claim 1, wherein the mixing frequency is not an integer multiple of the output rate, and wherein the method further comprises rotating each output sample through a constant angle relative to the immediately preceding output sample, wherein the constant angle depends on the mixing frequency and on the output rate.

4. The method of claim 1, wherein the signal is an ultrasound signal.

5. An apparatus for down-converting a sampled signal, the apparatus comprising a processing system configured to apply a mixing-and-combining operation to each of a succession of sub-sequences of input samples, the input samples being representative of a signal and having an initial sampling rate, to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

6. The apparatus of claim 5, wherein the processing system is configured to rotate each output sample through a constant angle relative to the immediately preceding output sample, wherein the constant angle depends on the mixing frequency and on the output rate.

7. The apparatus of claim 5, comprising an input for receiving data representative of a target centre frequency, and wherein the processing system is configured to determine the mixing frequency from the data representative of a target centre frequency, received at the input.

8. The apparatus of claim 5, wherein applying the mixing-and-combining operation comprises performing sample-wise multiplication of the sub-sequence of input samples with the values derived from the periodic mixing signal, to generate a set of sample-wise products, and calculating an average of the set of sample-wise products.

9. The apparatus of claim 8, wherein the apparatus comprises a memory for storing the values derived from the periodic mixing signal, and wherein the processing system is configured to fetch the values derived from the periodic mixing signal from the memory and to use the same values derived from the periodic mixing signal in each mixing-and-combining operation.

10. The apparatus of claim 5, wherein applying the mixing-and-combining operation comprises calculating a discrete Fourier transform of the sub-sequence of the input samples and generating the output sample from a magnitude of a Fourier-transform frequency bin centred on the mixing frequency.

11. The apparatus of claim 5, wherein applying the mixing-and-combining operation comprises applying a Goertzel-algorithm operation, at the mixing frequency, to the sub-sequence of the input samples, and generating the output sample from output of the Goertzel-algorithm operation.

12. The apparatus of claim 10, wherein the processing system is configured to calculate a common sub-sequence length for the sub-sequences that minimises a cost function that includes a cost term that scales with distance between a target centre frequency and a closest frequency-bin index to the target centre frequency.

13. The apparatus of claim 5, wherein the processing system is configured to apply a windowing function to the input samples or to samples of the periodic mixing signal.

14. A non-transitory computer-readable storage medium storing computer software which, when executed on one or more processors, causes the one or more processors to apply a mixing-and-combining operation to each of a succession of sub-sequences of input samples, the input samples being representative of a signal and having an initial sampling rate, to generate a sequence of output samples having an output rate lower than the initial sampling rate, wherein the sub-sequences of the input samples are spaced at intervals that correspond to the output rate, and wherein the mixing-and-combining operation generates a respective output sample from each sub-sequence wherein the output sample depends on a set of products of the input samples of the sub-sequence with respective values derived from a periodic mixing signal having a mixing frequency.

15. The non-transitory computer-readable storage medium of claim 14, wherein the computer software is a driver software and comprises an interface for receiving data representative of the output rate and of a target centre frequency from an application software.

* * * * *